US012349358B2

(12) United States Patent
Uechi et al.

(10) Patent No.: US 12,349,358 B2
(45) Date of Patent: Jul. 1, 2025

(54) SEMICONDUCTOR DEVICE AND SEMICONDUCTOR STORAGE DEVICE

(71) Applicant: KIOXIA CORPORATION, Tokyo (JP)

(72) Inventors: Tadayoshi Uechi, Kawasaki Kanagawa (JP); Takeshi Shimane, Matsudo Chiba (JP)

(73) Assignee: Kioxia Corporation, Tokyo (JP)

( * ) Notice: Subject to any disclaimer, the term of this patent is extended or adjusted under 35 U.S.C. 154(b) by 503 days.

(21) Appl. No.: 17/897,065

(22) Filed: Aug. 26, 2022

(65) Prior Publication Data

US 2023/0301109 A1    Sep. 21, 2023

(30) Foreign Application Priority Data

Mar. 18, 2022  (JP) ................. 2022-044725

(51) Int. Cl.
*H10B 43/40*    (2023.01)
*H01L 23/00*    (2006.01)
*H01L 25/065*   (2023.01)
*H01L 25/18*    (2023.01)
*H10B 41/40*    (2023.01)

(52) U.S. Cl.
CPC ............ *H10B 43/40* (2023.02); *H01L 24/08* (2013.01); *H01L 25/0657* (2013.01); *H01L 25/18* (2013.01); *H10B 41/40* (2023.02); *H01L 2224/08145* (2013.01); *H01L 2924/1431* (2013.01); *H01L 2924/14511* (2013.01)

(58) Field of Classification Search
CPC ...... H10B 43/40; H01L 24/08; H01L 25/0657
See application file for complete search history.

(56) References Cited

U.S. PATENT DOCUMENTS 5,014,105 A * 5/1991 Hata ..................... H10D 84/854
                                                   257/371
6,437,424 B1 * 8/2002 Noma .................... H10B 69/00
                                                   257/315
7,382,168 B2 * 6/2008 Bhattacharya ..............................
                                                   H03K 19/018592
                                                   326/38

(Continued)

FOREIGN PATENT DOCUMENTS

CN    102971797 B  * 12/2016 ............. G11C 11/39
CN    115623878 A  *  1/2023 ............... G11C 5/04

(Continued)

*Primary Examiner* — Laura M Menz
(74) *Attorney, Agent, or Firm* — Kim & Stewart LLP

(57) ABSTRACT

A semiconductor device has a third region between first and second regions on a substrate surface. A gate insulating film which is above the third region. A gate electrode is above the gate insulating film and includes a metal-containing layer. A first conductor is above the gate electrode. A first voltage can be applied to the first conductor. A second conductor is above the first region. A second voltage can be applied to the second conductor. A third conductor is above the first region. A third voltage different from the first and second can be applied to the third conductor. A metal oxide film is provided between the first region and the third conductor. An upper surface of the metal oxide film includes a portion at a height from the substrate that is lower than a height of an upper surface of the metal-containing layer.

20 Claims, 14 Drawing Sheets

(56) References Cited

U.S. PATENT DOCUMENTS

| | | | |
|---|---|---|---|
| 7,955,919 | B2 | 6/2011 | Pritchard et al. |
| 9,933,806 | B2 * | 4/2018 | Onoya ............... H10D 30/6755 |
| 10,141,327 | B2 * | 11/2018 | Sonehara ................. H10D 1/00 |
| 11,694,995 | B2 * | 7/2023 | Kono .................. H01L 25/0657 |
| | | | 257/314 |
| 12,100,754 | B2 * | 9/2024 | Lin ....................... H01L 21/225 |
| 2002/0056810 | A1 | 5/2002 | Kobayashi ............. H04N 25/30 |
| | | | 257/E27.132 |
| 2007/0046338 | A1 * | 3/2007 | Bhattacharya .............................. |
| | | | H03K 19/018521 |
| | | | 327/112 |
| 2016/0056067 | A1 | 2/2016 | Endo et al. |
| 2017/0235325 | A1 * | 8/2017 | Onoya ................... H10D 84/85 |
| | | | 323/313 |
| 2017/0278854 | A1 * | 9/2017 | Abe ....................... H10D 30/69 |
| 2018/0075886 | A1 * | 3/2018 | Ishizu ................ G11C 14/0054 |
| 2020/0027833 | A1 * | 1/2020 | Lee ......................... H01L 24/20 |
| 2021/0343861 | A1 * | 11/2021 | Lin ..................... H10D 62/393 |
| 2022/0084984 | A1 * | 3/2022 | Kono ...................... H10B 41/27 |
| 2022/0246632 | A1 * | 8/2022 | Shimane ................. H01L 24/80 |
| 2022/0367394 | A1 * | 11/2022 | Sun .......................... G11C 5/04 |
| 2023/0301109 | A1 * | 9/2023 | Uechi .................... H10B 43/27 |
| | | | 257/314 |
| 2023/0317718 | A1 * | 10/2023 | Sharma ................. H01L 23/485 |
| | | | 257/20 |
| 2023/0326509 | A1 * | 10/2023 | Tang ..................... H10B 51/20 |
| | | | 365/145 |
| 2024/0306402 | A1 * | 9/2024 | Futatsuyama .......... G11C 16/16 |
| 2024/0371987 | A1 * | 11/2024 | Lin ........................ H10D 12/01 |

FOREIGN PATENT DOCUMENTS

| | | | | |
|---|---|---|---|---|
| CN | 118632536 | A * | 9/2024 | ......... G11C 16/0483 |
| CN | 118943145 | A * | 11/2024 | ....... H01L 29/41733 |
| FR | 2959626 | A1 * | 11/2011 | ......... H03F 3/45179 |
| JP | 3837253 | B2 | 10/2006 | |
| JP | 2017146968 | A * | 8/2017 | ............... G05F 3/08 |
| JP | 6901863 | B2 * | 7/2021 | ............... G05F 3/08 |
| JP | 2023040926 | A * | 3/2023 | ......... G11C 16/0483 |
| JP | 7341253 | B2 * | 9/2023 | ....... H01L 21/76224 |
| JP | 2023138170 | A * | 9/2023 | ............. H01L 24/08 |
| WO | WO-2014071634 | A1 * | 5/2014 | ......... H01L 29/7869 |
| WO | WO-2016166635 | A1 * | 10/2016 | ............. C23C 14/34 |

* cited by examiner

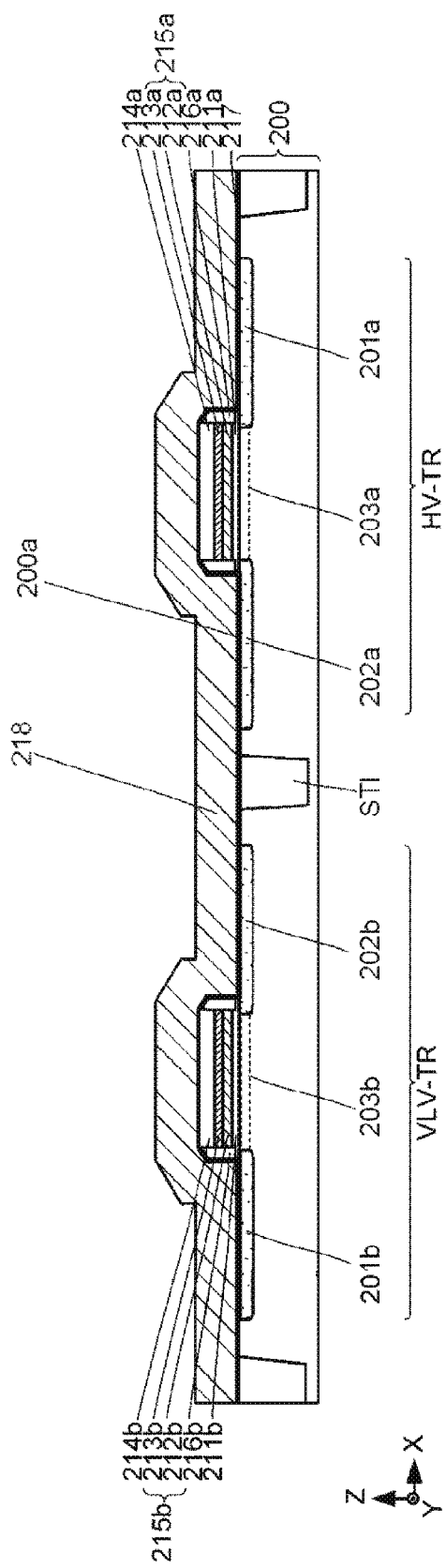
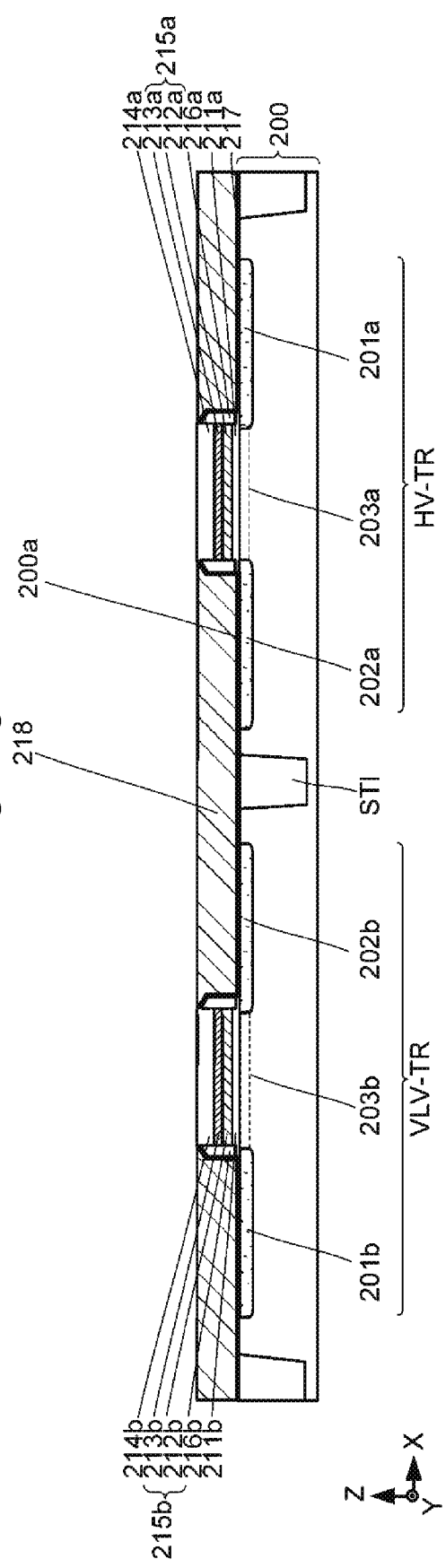

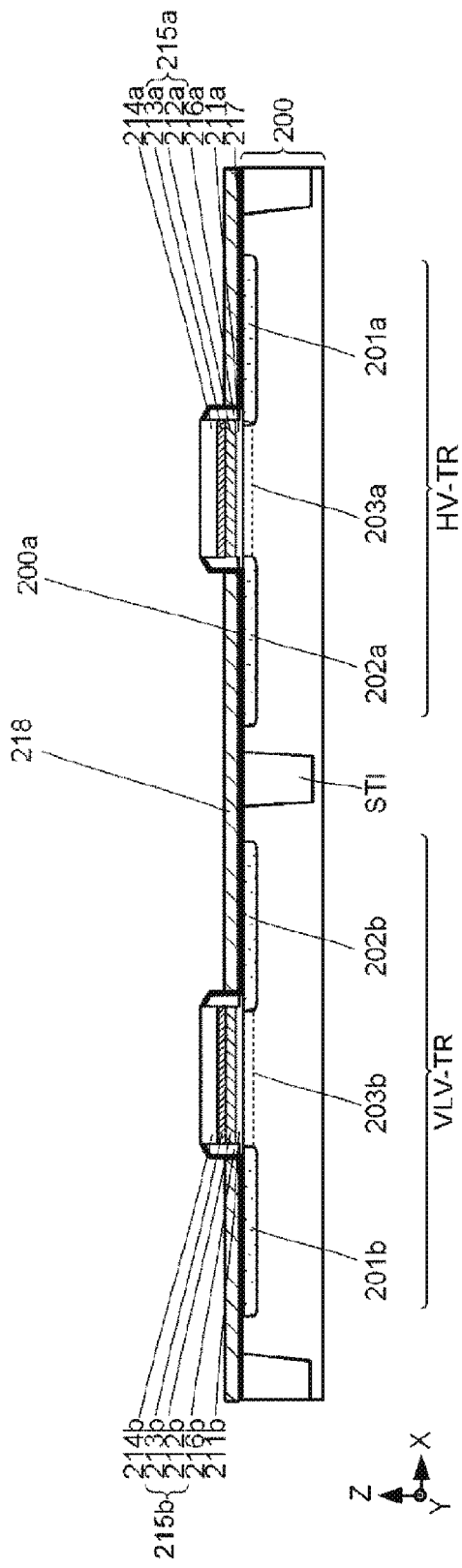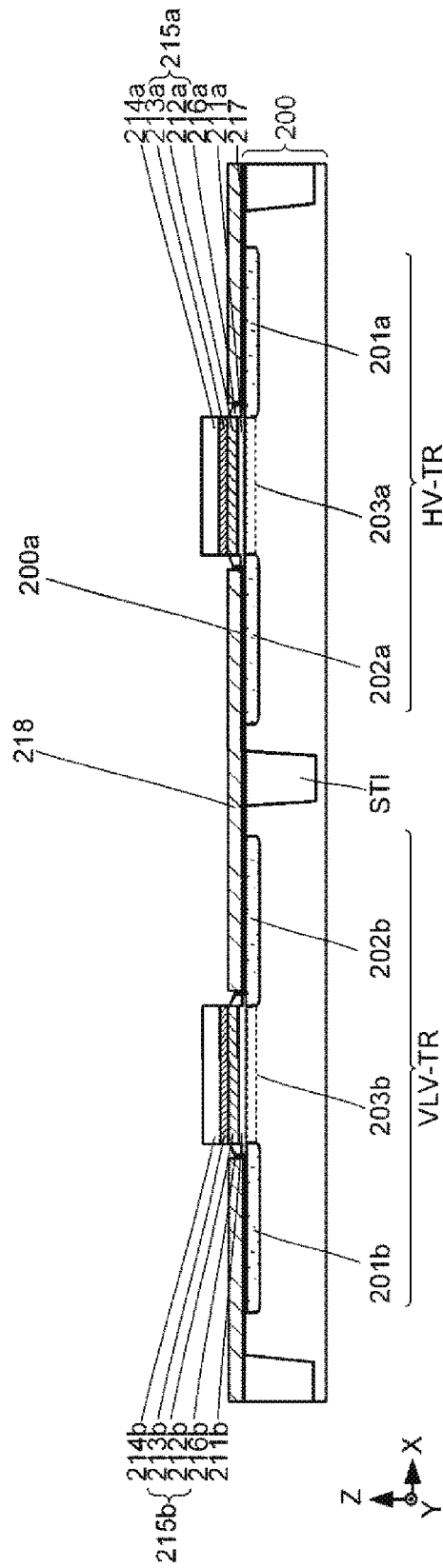

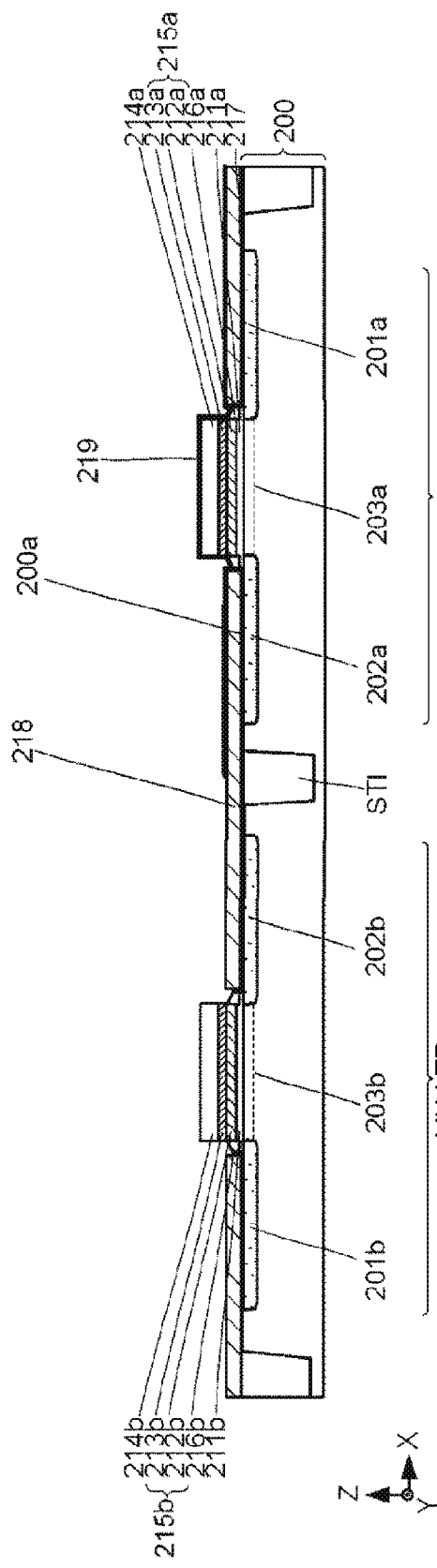
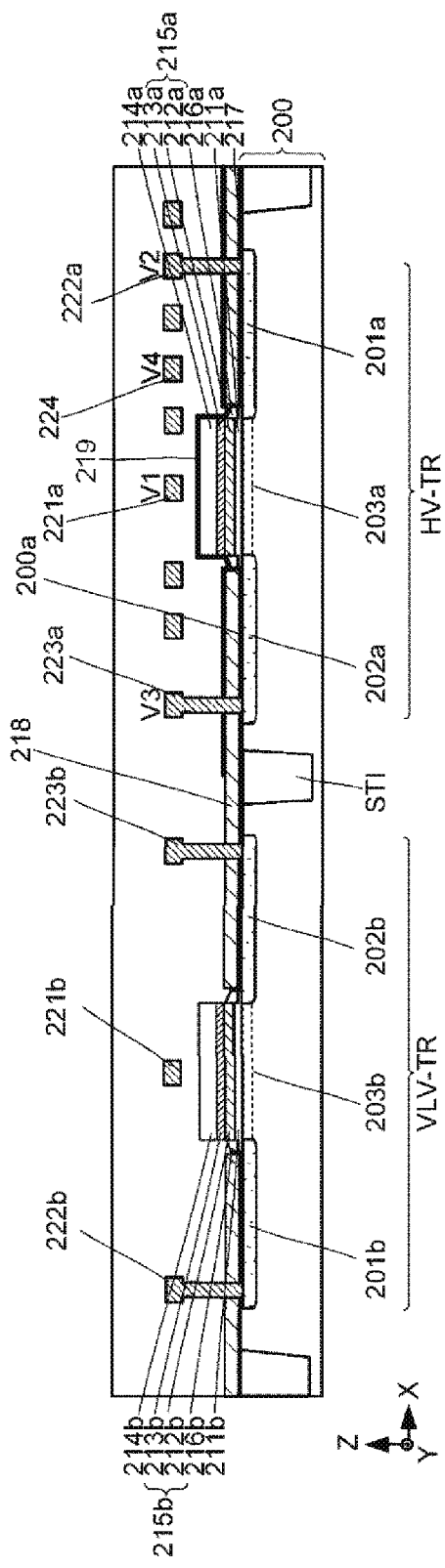

SEMICONDUCTOR DEVICE AND SEMICONDUCTOR STORAGE DEVICE

CROSS-REFERENCE TO RELATED APPLICATION

This application is based upon and claims the benefit of priority from Japanese Patent Application No. 2022-044725, filed Mar. 18, 2022, the entire contents of which are incorporated herein by reference.

FIELD

Embodiments described herein relate generally to a semiconductor device and a semiconductor storage device.

BACKGROUND

A semiconductor storage device including a memory cell array and a peripheral circuit is known.

BRIEF DESCRIPTION OF THE DRAWINGS

FIGS. 14-19 are cross-sectional views schematically illustrating aspects of a method of manufacturing a semiconductor device.

DETAILED DESCRIPTION

Figure 1:
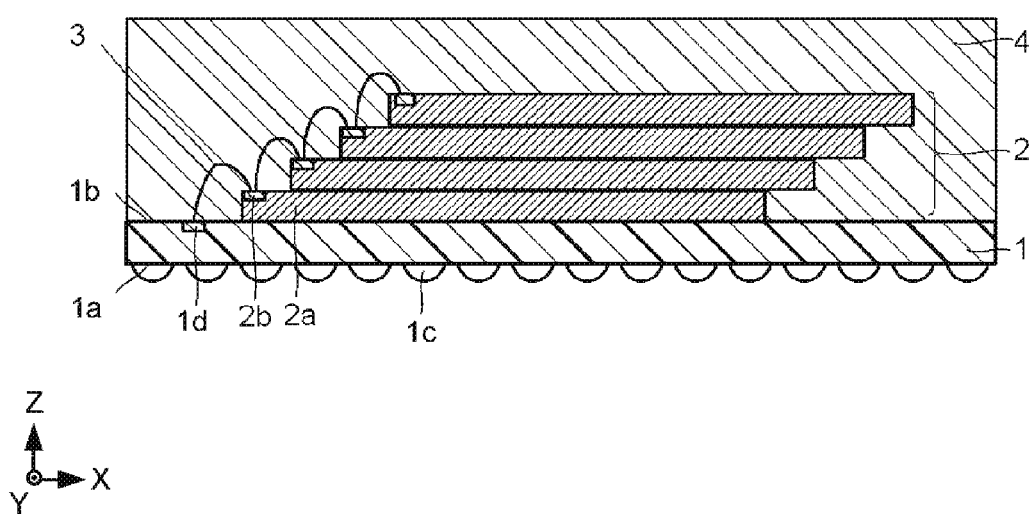
FIG. 1 depicts a configuration example of semiconductor device incorporating a memory chip.

Embodiments provide a semiconductor device and a semiconductor storage device that have high reliability.

In general, according to one embodiment, a semiconductor device includes a semiconductor substrate with a first region of an n-type conductivity type, a second region of an n-type conductivity type spaced from the first region in a first direction along a surface of the substrate, and a third region between the first region and the second region in the first direction. A gate insulating film is above the third region in a second direction orthogonal to the surface. A gate electrode is above the gate insulating film in the second direction and includes a metal-containing layer. A first conductor is above the gate electrode in the second direction and electrically connected to the gate electrode. The first conductor is configured to be applied with a first voltage. A second conductor is above the first region in the second direction and electrically connected to the first region. The second conductor is configured to be applied with a second voltage. A third conductor is above the first region in the second direction and is configured to be applied with a third voltage that is lower than the first and second voltages. A metal oxide film is between the first region and the third conductor in the second direction. An upper surface of the metal oxide film includes a first area having a height from the surface of the substrate in the second direction that is less than a height of an upper surface of the metal-containing layer from the surface of the substrate in the second direction.

Hereinafter, certain example embodiments are described with reference to the drawings. The drawings are, in general, schematic. As such, the depicted relationships in the drawings between various dimensions of each component illustrated, the ratios between different component dimensions illustrated, and the like may differ from those of an actual product. Furthermore, in the description, components or aspects which are substantially the same as one another are designated by the same reference numerals, and the description thereof may be omitted as appropriate.

FIG. 1 is a cross-sectional view schematically illustrating a semiconductor device. The depicted semiconductor device is a semiconductor storage device that includes a wiring substrate 1, a chip stacked body 2, bonding wires 3, and an insulating resin layer 4.

The wiring substrate 1 includes a surface 1a, a surface 1b on a side opposite to the surface 1a, a plurality of external connection terminals 1c provided on the surface 1a, and a plurality of bonding pads 1d provided on the surface 1b. Examples of the wiring substrate 1 include a printed wiring board (PWB). The surfaces 1a and 1b extend, for example, in planes parallel to the X-axis direction and the Y-axis direction. A thickness direction of the wiring substrate 1 is the Z-axis direction.

The external connection terminals 1c are formed, for example, by using gold, copper, or solder. The external connection terminals 1c may be formed by using a tin-silver-based or a tin-silver-copper-based lead-free solder. In addition, the external connection terminals 1c may be formed by stacking a plurality of metal materials. In FIG. 1, the external connection terminals 1c is formed with a conductive ball, but the external connection terminals 1c may also be formed by using a bump.

The plurality of bonding pads 1d are connected to the plurality of external connection terminals 1c via internal wiring of the wiring substrate 1. The plurality of bonding pads 1d comprise, for example, a metal element such as copper, silver, gold, or nickel. The plurality of bonding pads 1d may be formed, for example, by plating a metal film by an electrolytic plating method, an electroless plating method, or the like. In addition, the plurality of bonding pads 1d may be formed by using a conductive paste.

The chip stacked body 2 includes a plurality of memory chips 2a. The plurality of memory chips 2a are, for example, gradually stacked on the surface 1b of the wiring substrate 1 in the Z-axis direction. In other words, the plurality of memory chips 2a are partially overlapped with each other. The plurality of memory chips 2a are adhered to each other with an adhesive layer such as a die attach film interposed therebetween. The chip stacked body 2 illustrated in FIG. 1 has four memory chips 2a, but the number of memory chips 2a is not limited to the number illustrated in FIG. 1.

The plurality of memory chips 2a each have a plurality of connection pads 2b. The plurality of memory chips 2a are connected to each other in parallel, via the plurality of bonding wires 3 and are simultaneously connected to the bonding pads 1d in series.

The insulating resin layer 4 covers the chip stacked body 2. The insulating resin layer 4 contains an inorganic filler such as silicon oxide ($SiO_2$) For example, the insulating resin layer 4 is a sealing resin obtained by mixing an inorganic filler with an organic resin. The insulating resin layer 4 is formed by a molding method such as a transfer mold method, a compression mold method, and an injection mold method.

Figure 2:
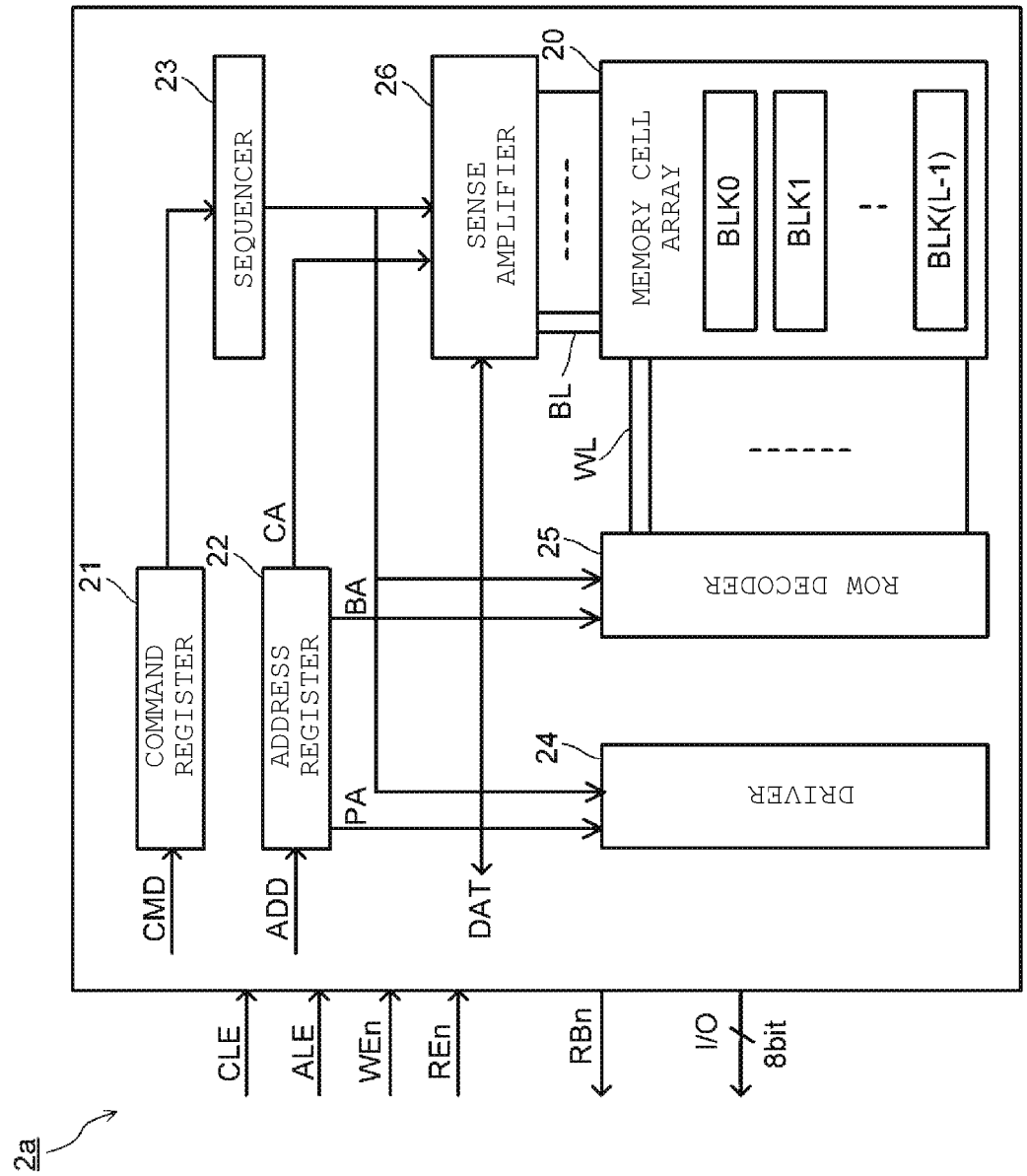
FIG. 2 is a block diagram illustrating a memory chip.

FIG. 2 is a block diagram illustrating a configuration example of the memory chip 2a. The memory chip 2a includes a memory cell array 20, a command register 21, an address register 22, a sequencer 23, a driver 24, a row decoder 25, and a sense amplifier 26.

The memory cell array 20 includes a plurality of blocks BLK (BLK0 to BLK(L−1) (L is a natural number of 2 or more)). The block BLK is a set of a plurality of memory transistors MT that store data in a nonvolatile manner.

The memory cell array 20 is connected to a plurality of word lines WL and a plurality of bit lines BL. The memory transistors MT each are connected to one of the plurality of word lines WL and one of the plurality of bit lines BL.

The command register 21 stores a command signal CMD received from the memory controller. The command signal CMD includes, for example, instruction data, for example, for causing the sequencer 23 to perform a read operation, a write operation, and an erasing operation.

The address register 22 stores an address signal ADD received from the memory controller. The address signal ADD includes, for example, a block address BA, a page address PA, and a column address CA. For example, the block address BA, the page address PA, and the column address CA are used for selecting the block BLK, the word line WL, and the bit line BL, respectively.

The sequencer 23 controls an operation of the memory chip 2a. The sequencer 23 controls the driver 24, the row decoder 25, the sense amplifier 26, and the like, for example, based on the command signal CMD stored in the command register 21, and performs an operation such as a read operation, a write operation, and an erasing operation.

The driver 24 generates a voltage to be used for a read operation, a write operation, an erasing operation, or the like. The driver 24 includes, for example, a DA converter. Also, the driver 24 applies, for example, the generated voltage to a signal line corresponding to the selected word line WL based on the page address PA stored in the address register 22.

The row decoder 25 selects one block BLK in the corresponding memory cell array 20 based on the block address BA stored in the address register 22. Also, the row decoder 25 transmits, for example, the voltage applied to a signal line corresponding to the selected word line WL to the selected word line WL in the selected block BLK.

In the write operation, the sense amplifier 26 applies a desired voltage to each bit line BL according to write data DAT received from the memory controller. In addition, in the read operation, the sense amplifier 26 determines data stored in the memory cell based on the voltage of the bit line BL and transmits the determination result to the memory controller as read data DAT.

The communication between the memory chip 2a and the memory controller supports, for example, a NAND interface standard. For example, the communication between the memory chip 2a and the memory controller uses a command latch enable signal CLE, an address latch enable signal ALE, a write enable signal WEn, a read enable signal REn, a ready busy signal RBn, and an input/output signal I/O.

The command latch enable signal CLE indicates that the input/output signal I/O received by the memory chip 2a is the command signal CMD. The address latch enable signal ALE indicates that the received signal I/O is the address signal ADD. The write enable signal WEn is a signal for instructing the memory chip 2a to input the input/output signal I/O. The read enable signal REn is a signal for instructing the memory chip 2a to output the input/output signal I/O.

The ready busy signal RBn is a signal for notifying the memory controller whether the memory chip 2a is in a ready state in which an instruction is received from the memory controller or a busy state in which an instruction is not received.

The input/output signal I/O is, for example, a signal of 8-bit width, and can include a signal such as the command signal CMD, the address signal ADD, a write data signal DAT, and the like.

The memory chip 2a and the memory controller described above may form one semiconductor storage device in combination. Examples of the semiconductor storage device include a memory card, such as an SD card, or a solid-state drive (SSD).

Figure 3:
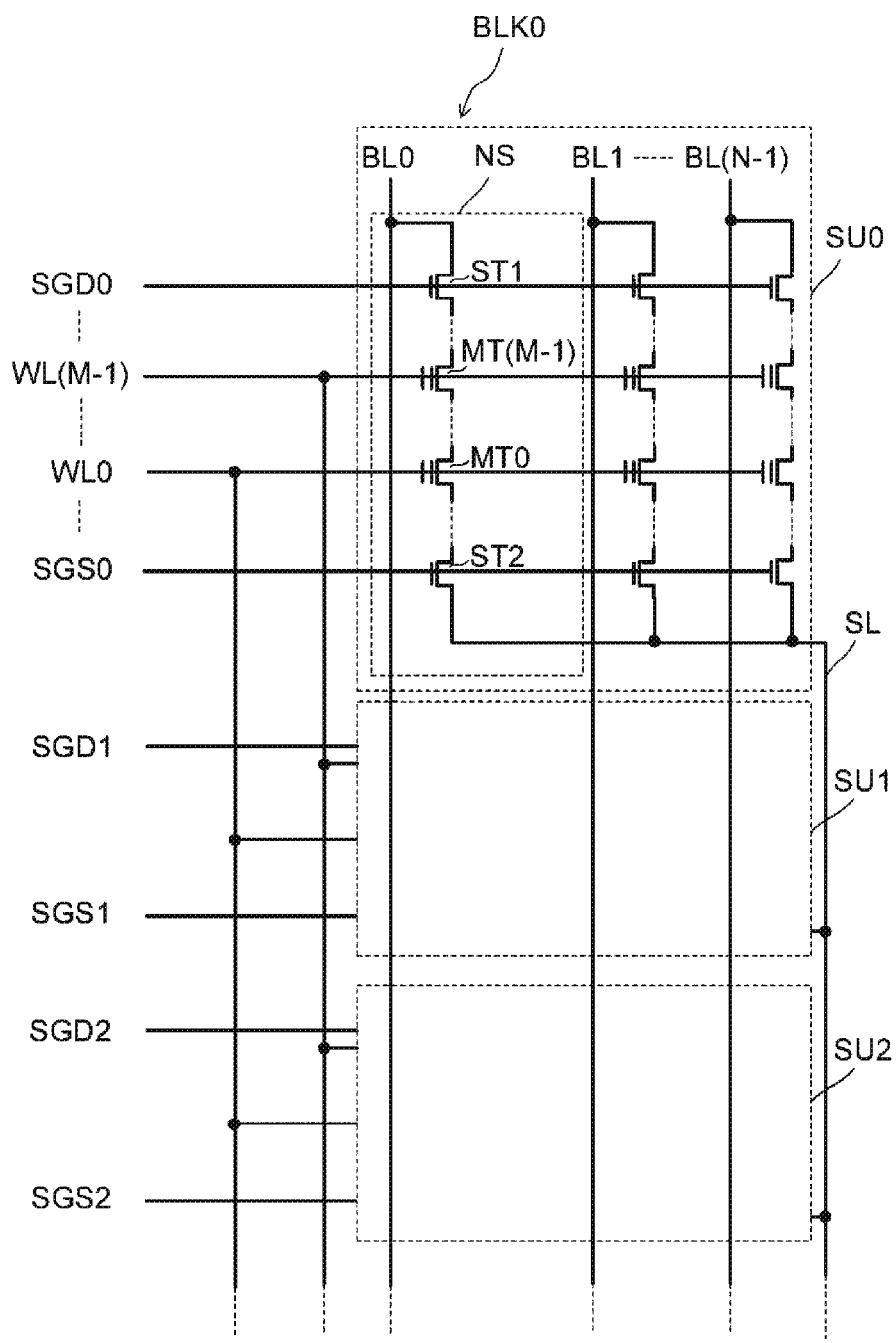
FIG. 3 is a circuit diagram illustrating a circuit configuration of a memory cell array.

Subsequently, the circuit configuration example of the memory cell array 20 is described. FIG. 3 is a circuit diagram illustrating a circuit configuration of the memory cell array 20. Although FIG. 3 illustrates the block BLK0 as an example, the other blocks BLK have the same configuration.

The block BLK includes a plurality of string units SU. The string units SU each include a plurality of NAND strings NS. In addition, FIG. 3 illustrates three string units SU (SU0 to SU2), but the number of string units SU is not particularly limited.

The NAND strings NS each are connected to one of the plurality of bit lines BL (BL0 to BL(N−1) (N is a natural number of 2 or more)). The NAND strings NS each include the memory transistors MT, a select transistor ST1, and a select transistor ST2.

The memory transistor MT includes a control gate, a charge storage layer, and stores data in a nonvolatile manner. FIG. 3 illustrates the plurality of memory transistors MT (MT0 to MT(M−1) (M is a natural number of 2 or more)), but the number of memory transistors MT is not particularly limited. In addition, the NAND strings NS each may include a dummy memory transistor. The dummy memory transistor has the same structure as the memory transistor MT, but is not used for storing data.

The memory transistors MT each may have a MONOS type using an insulating film for the charge storage layer, and may have an FG type using a conductor layer in the charge storage layer. Hereinafter, in the present embodiment, a MONOS type is exemplified.

The select transistor ST1 is used for selecting the string units SU during various operations. The number of select transistors ST1 is not particularly limited.

The select transistor ST2 is used for selecting the string unit SU during various operations. The number of select transistors ST2 is not particularly limited.

In each NAND string NS, the drain of the select transistor ST1 is connected to the corresponding bit line BL. The source of the select transistor ST1 is connected to one end of the memory transistors MT connected to each other in series. The other end of the memory transistors MT connected to each other in series is connected to the drain of the select transistor ST2.

In the same block BLK, the source of the select transistor ST2 is connected to a source line SL. The gates of the select transistors ST1 of the string units SU are connected to corresponding select gate lines SGD, respectively. The control gates of the memory transistors MT are connected to the corresponding word lines WL, respectively. The gates of the select transistor ST2 are connected to corresponding select gate lines SGS.

The plurality of NAND strings NS to which the same column address CA is allocated are connected to the same bit line BL among the plurality of blocks BLK. The source line SL is connected between the plurality of blocks BLK.

First Structural Example of Memory Chip 2a

Figure 4:
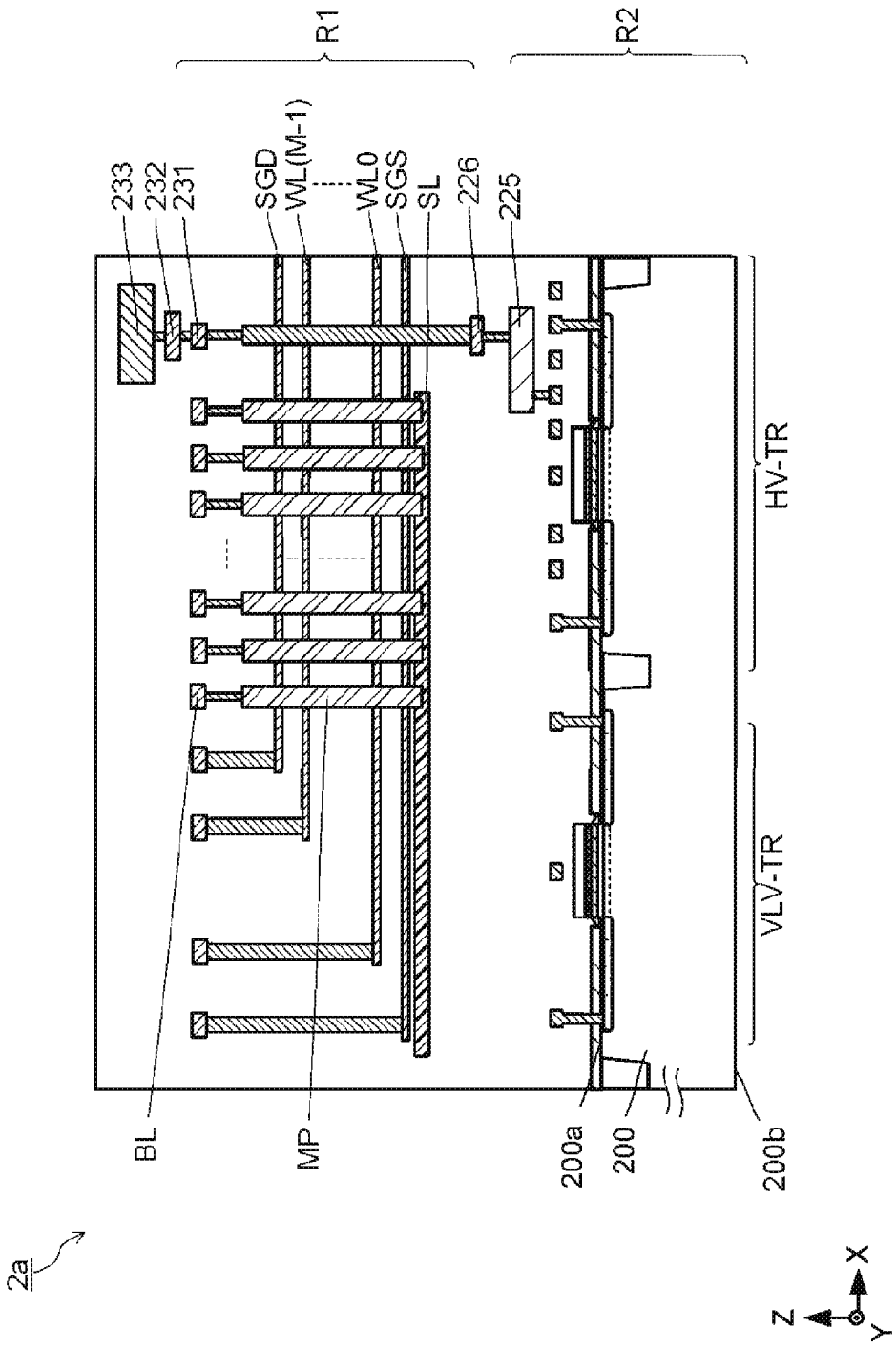
FIG. 4 is a cross-sectional view schematically illustrating a first structural example of a memory chip.

FIG. 4 is a cross-sectional view schematically illustrating a first structural example of the memory chip 2a.

The memory chip 2a illustrated in FIG. 4 has a first area R1 including the memory cell array 20 illustrated in FIG. 1 and a second area R2 including peripheral circuits such as the command register 21, the address register 22, the sequencer 23, the driver 24, the row decoder 25, and the sense amplifier 26 illustrated in FIG. 1 under the memory cell array 20.

FIG. 4 illustrates a high voltage drive transistor HV-TR, an ultra-low voltage drive transistor VLV-TR, a source line SL, a memory pillar MP, the select gate line SGS, word lines WL (the word lines WL0 to WL(M−1)), a select gate line SGD, bit lines BL, a conductive layer 225, a conductive layer 226, a conductive layer 231, a conductive layer 232, and a conductive layer 233 formed on the semiconductor substrate 200. An insulating layer is provided among the depicted components as needed.

The semiconductor substrate 200 has a surface 200a and a surface 200b on a side opposite to the surface 200a. Examples of the semiconductor substrate 200 include a silicon substrate.

The high voltage drive transistor HV-TR has a high insulation breakdown voltage for the purpose of handling a high voltage. The drive voltage of the high voltage drive transistor HV-TR is higher than the drive voltage of the ultra-low voltage drive transistor VLV-TR. The high voltage drive transistor HV-TR is, for example, an N-channel-type field effect transistor (Nch-FET). The high voltage drive transistor HV-TR is used as a switch for high voltage transmission in the row decoder 25 or a booster circuit such as in the sense amplifier 26.

The ultra-low voltage drive transistor VLV-TR has an insulation breakdown voltage much lower than the high voltage drive transistor HV-TR which helps provide high speed operations. The ultra-low voltage drive transistor VLV-TR is, for example, an N-channel-type field effect transistor or a P-channel-type field effect transistor (Pch-FET). The ultra-low voltage drive transistor VLV-TR can be used, for example, in a peripheral circuit such as an interface to provide low voltage driving and high speed operation.

Figure 5:
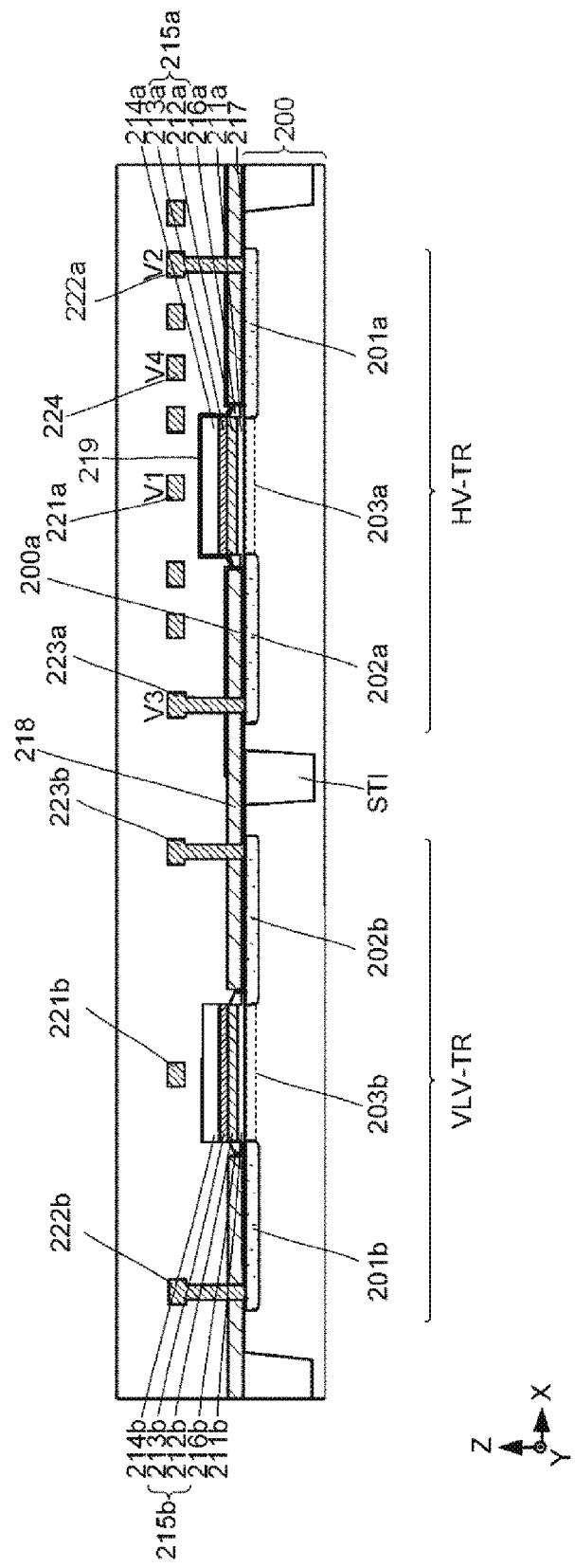
FIG. 5 is a cross-sectional view schematically illustrating a structural example of a high voltage drive transistor and an ultra-low voltage drive transistor.
Figure 6:
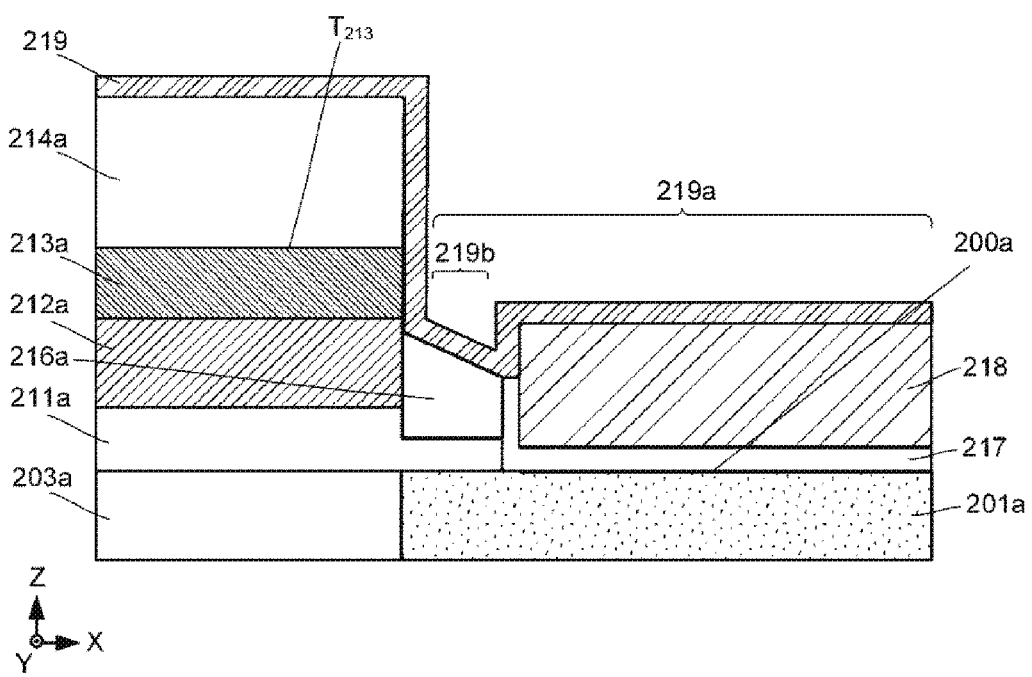
FIG. 6 is an enlarged view of a portion of FIG. 5.

FIG. 5 is a cross-sectional view schematically illustrating a structural example of the high voltage drive transistor HV-TR and the ultra-low voltage drive transistor VLV-TR. FIG. 6 is an enlarged view of a portion of FIG. 5.

FIG. 5 illustrates a high voltage drive transistor HV-TR, an ultra-low voltage drive transistor VLV-TR, a conductor 221a, a conductor 221b, a conductor 222a, a conductor 222b, a conductor 223a, a conductor 223b, and a conductor 224.

The high voltage drive transistor HV-TR and the ultra-low voltage drive transistor VLV-TR are electrically separated (isolated) from each other by an element separator such as a shallow trench isolation (STI) feature. FIG. 5 illustrates the high voltage drive transistor HV-TR and the ultra-low voltage drive transistor VLV-TR as being closely adjacent to each other, but this is primarily for explanatory convenience, and the high voltage drive transistor HV-TR and the ultra-low voltage drive transistor VLV-TR may be provided at positions separated from each other by relatively larger distances and/or with other elements therebetween.

The high voltage drive transistor HV-TR includes an impurity area 201a, an impurity area 202a, a channel forming area 203a, a gate insulating film 211a, a semiconductor layer 212a, a metal-containing layer 213a, and an insulating layer 214a.

The ultra-low voltage drive transistor VLV-TR includes an impurity area 201b, an impurity area 202b, a channel forming area 203b, a gate insulating film 211b, a semiconductor layer 212b, a metal-containing layer 213b, and an insulating layer 214b.

The impurity area 201a and the impurity area 202a are spaced from each other in the X-axis direction on the surface 200a. The impurity area 201a and the impurity area 202a have an n-type conductivity type and form the source area and the drain area of the high voltage drive transistor HV-TR. The impurity area 201a and the impurity area 202a include, for example, donor impurities (dopants) that give an n-type conductivity type such as phosphorus (P) and arsenic (As).

The channel forming area 203a is provided, for example, on the surface 200a between the impurity area 201a and the impurity area 202a in the X-axis direction. The channel forming area 203a has a concentration of donor impurities (a donor concentration) lower than each of the impurity area 201a and the impurity area 202a. The channel forming area 203a may include donor impurities such as phosphorus and arsenic that give an n-type conductivity type. The channel forming area 203a may include, for example, acceptor impurities (dopants) that give a p-type conductivity type such as boron (B). The channel forming area 203a forms a channel of the high voltage drive transistor HV-TR.

The impurity area 201b and the impurity area 202b are spaced from each other in the X-axis direction on the surface 200a. The impurity area 201b and the impurity area 202b have an n-type or p-type conductivity type, and form the source area and the drain area of the ultra-low voltage drive transistor VLV-TR. The impurity area 201b and the impurity area 202b having the p-type conductivity type include, for example, acceptor impurities that give a p-type conductivity type such as boron. The impurity area 201b and the impurity area 202b having the n-type conductivity type include donor impurities that give an n-type conductivity type such as phosphorus and arsenic.

The channel forming area 203b is, for example, provided on the surface 200a between the impurity area 201b and the impurity area 202b in the X-axis direction. The channel forming area 203b has a concentration of impurities (donor concentration or acceptor concentration) that give the conductivity type, which is lower than each of the concentrations of the impurity area 201b and the impurity area 202b. The channel forming area 203b may include impurities that give a conductivity type opposite to the conductivity type.

The channel forming area 203b forms a channel of the ultra-low voltage drive transistor VLV-TR.

The gate insulating film 211a is provided on the channel forming area 203a. The gate insulating film 211b is provided on the channel forming area 203b. The gate insulating film 211a and the gate insulating film 211b include, for example, silicon, oxygen, or nitrogen.

The gate insulating film 211a is preferably thicker than the gate insulating film 211b. Accordingly, the insulation breakdown voltage of the high voltage drive transistor HV-TR can be higher than the insulation breakdown voltage of the ultra-low voltage drive transistor VLV-TR. In addition, by causing the gate insulating film 211b to be thinner than the gate insulating film 211a, the operation speed of the ultra-low voltage drive transistor VLV-TR can be improved.

The semiconductor layer 212a is provided on the gate insulating film 211a. The semiconductor layer 212b is provided on the gate insulating film 211b. The semiconductor layer 212a and the semiconductor layer 212b are a semiconductor material having an n-type conductivity type and are, for example, a polysilicon layer doped with phosphorus.

The metal-containing layer 213a is provided on the semiconductor layer 212a. The metal-containing layer 213b is provided on the semiconductor layer 212b. The metal-containing layer 213a and the metal-containing layer 213b comprise, for example, tungsten or titanium.

The insulating layer 214a is provided on the metal-containing layer 213a. The insulating layer 214b is provided on the metal-containing layer 213b. The insulating layer 214a and the insulating layer 214b function as etching stoppers when a contact plug is formed on a gate electrode. The insulating layer 214a and the insulating layer 214b comprise, for example, silicon and nitrogen.

The semiconductor layers 212a and the metal-containing layers 213a are respectively stacked to form gate electrodes 215a of the high voltage drive transistor HV-TR. The semiconductor layers 212b and the metal-containing layers 213b are respectively stacked to form gate electrodes 215b of the ultra-low voltage drive transistor VLV-TR.

An insulating layer 216a is in contact with the side surface of the semiconductor layer 212a but is not in contact with the side surface of the metal-containing layer 213a and the side surface of the insulating layer 214a. An insulating layer 216b is in contact with the side surface of the semiconductor layer 212b but is not in contact with the side surface of the metal-containing layer 213b and the side surface of the insulating layer 214b. The insulating layer 216a and the insulating layer 216b comprise silicon and oxygen. The insulating layer 216a and the insulating layer 216b function as the side walls of the high voltage drive transistor HV-TR and the ultra-low voltage drive transistor VLV-TR, respectively. The insulating layer 216a and the insulating layer 216b may not need to be provided in some examples.

An insulating layer 217 is provided on the impurity area 201a, the impurity area 201b, the impurity area 202a, and the impurity area 202b. The insulating layer 217 comprises, for example, silicon and oxygen. The insulating layer 217 appears as a dark, bold line in FIG. 5.

An insulating layer 218 is provided on the insulating layer 217. The insulating layer 218 comprises, for example, silicon, oxygen, and/or nitrogen. The insulating layer 218 functions as an interlayer insulating film.

A metal oxide film 219 is provided on the insulating layer 214a, the insulating layer 216a, and the insulating layer 217. The metal oxide film 219 appears as another dark, bold line in FIG. 5. The metal oxide film 219 is provided above the impurity area 201a, the impurity area 202a, and the channel forming area 203a. As illustrated in FIG. 6, the upper surface of the metal oxide film 219 includes an area 219a for which the height above the surface 200a in the Z-axis direction is lower than the upper surface $T_{213}$ of the metal-containing layer 213a. The area 219a may further include an area 219b that is in contact with or on the insulating layer 216a. The area 219b can also be in contact with or on the side surface of the semiconductor layer 212a.

The dielectric constant (relative permittivity) of the metal oxide film 219 is 9 or more, and preferably 15 or more. Although the upper limit of dielectric constant of the metal oxide film 219 is not particularly limited, the crystal structure typically changes with thinning, and the effective dielectric constant decreases. Therefore, the upper limit is, for example, 200 or less. Examples of the metal oxide film 219 include films of hafnium oxide (dielectric constant: 15 to 18), cubic hafnium oxide (dielectric constant: 40), hafnium nitride aluminate (dielectric constant: 18), tantalum oxide (dielectric constant: 22), titanium oxide (dielectric constant: 80), yttrium oxide (dielectric constant: 15), zirconium oxide (dielectric constant: 25), lanthanum oxide (dielectric constant: 30), OG-lanthanum aluminate (dielectric constant: 30), lanthanum cerium silicate (dielectric constant: 17.4), cerium oxide (dielectric constant: 80), and aluminum oxide (dielectric constant: 9 to 10). The thickness of the metal oxide film 219 is not particularly limited, and may be, for example, less than the thickness of the insulating layer 217.

It is preferable that metal oxide film 219 not be provided above the ultra-low voltage drive transistor VLV-TR in the Z-axis direction, and also not above the impurity area 201b, the impurity area 202b, and the channel forming area 203b. By this arrangement, it is possible to prevent unnecessary capacitance from being formed by the metal oxide film 219 being positioned above the ultra-low voltage drive transistor VLV-TR, and thus avoid a decrease of the operation speed of the ultra-low voltage drive transistor VLV-TR.

The conductor 221a is provided above the gate electrode 215a in the Z-axis direction and for example, is electrically connected to the gate electrode 215a via a contact plug penetrating the insulating layer 214a. The conductor 221a is, for example, electrically connected to the word lines WL. For example, a voltage V1 is applied to the conductor 221a. The voltage V1 is, for example, 28 V to 32 V.

The conductor 222a is provided above the impurity area 201a in the Z-axis direction and is electrically connected to the impurity area 201a, for example, via a contact plug. For example, a voltage V2 is applied to the conductor 222a. The voltage V2 is, for example, 24 V to 26 V.

The conductor 223a is provided above the impurity area 202a in the Z-axis direction, and is electrically connected to the impurity area 202a, for example, via a contact plug. For example, a voltage V3 is applied to the conductor 223a. The voltage V3 is, for example, 24 V to 26 V.

The conductor 224 is provided above the impurity area 201a in the Z-axis direction. The conductor 224 is electrically connected to a bit line BL, a word line WL, or the like. A voltage V4 is applied to the conductor 224. For example, the voltage V4 applied when the bit line BL or the word line WL electrically connected to the conductor 224 is not selected is lower than the voltage V1 and the voltage V2. For example, the voltage V4 is 0 V to 10 V. The difference between the voltage V1 and the voltage V4 and the voltage V2 and the voltage V4 are both, for example, 24.5 V or more. The voltage V4 is lower than the voltage V3.

FIG. 5 illustrates three conductors 224 between the conductor 221a and the conductor 222a, two conductors 224 between the conductor 221a and the conductor 223a, one conductor 224 on a side opposite to the conductor 221a of the conductor 222a in the X-axis direction, but the number of conductors 224 is not limited to the number illustrated in FIG. 5. If the plurality of conductors 224 are provided, the voltage V4 applied to each of the plurality of conductors 224 may be different from each other.

The conductors 221a, 222a, 223a, and the conductor 224 each form wiring. The conductors 221a, 222a, 223a, and the conductor 224 are formed on the same layer. The conductor 224 is provided between the conductor 221a and the conductor 222a or between the conductor 221a and the conductor 223a.

The conductor 221b is provided above the gate electrode 215b in the Z-axis direction, and is, for example, electrically connected to the gate electrode 215b via a contact plug penetrating the insulating layer 214b.

The conductor 222b is provided above the impurity area 201b in the Z-axis direction and is electrically connected to the impurity area 201b, for example, via a contact plug.

The conductor 223b is provided above the impurity area 202b in the Z-axis direction and is electrically connected to the impurity area 202b, for example, via a contact plug.

The conductors 221b, 222b, 223b each function as wiring. The conductors 221a, 222b, 223a, and the conductor 224 are formed on the same layer.

The conductive layer 225 and the conductive layer 226 are connected to the conductor 224, for example, via a plurality of contact plugs.

The source line SL is provided above the field effect transistor. The select gate line SGS is provided above the source line SL. The word lines WL are sequentially provided above the select gate line SGS. The select gate line SGD is provided above the plurality of word lines WL. The bit lines BL are provided above the select gate line SGD.

Figure 7:
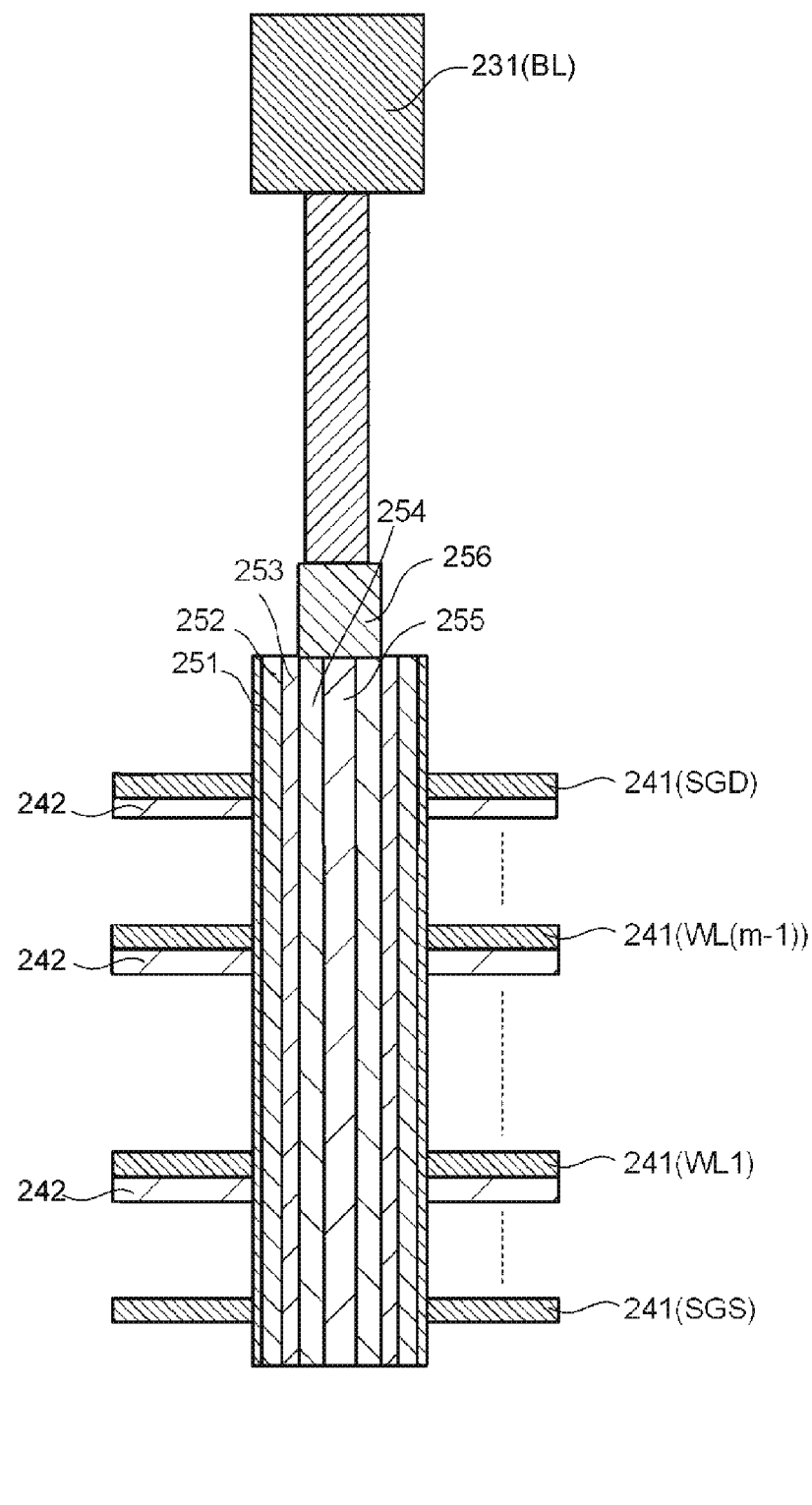
FIG. 7 is a cross-sectional view schematically illustrating a structural example of a memory pillar.

The memory pillar MP extends to penetrate the stacked body including the select gate line SGS, the plurality of word lines WL, and the select gate line SGD. Here, the structural example of the memory pillar MP is described. FIG. 7 is a cross-sectional view schematically illustrating the structural example of the memory pillar MP. FIG. 7 illustrates a conductive layer 241, an insulating layer 242, a block insulating film 251, a charge storage film 252, a tunnel insulating film 253, a semiconductor layer 254, a core insulating layer 255, a cap layer 256, and the conductive layer 231.

A conductive layer 241 and an insulating layer 242 are alternately stacked to form a stacked body. The certain ones of the plurality of conductive layers 241 function as the select gate line SGS, the word lines WL, the select gate line SGD. The conductive layers 241 include a metal material. The insulating layers 242 are, for example, silicon oxide.

The block insulating film 251, the charge storage film 252, the tunnel insulating film 253, the semiconductor layer 254, and the core insulating layer 255 form the memory pillar MP. Each of these described components of the memory pillar MP extends in the Z-axis direction. One memory pillar MP corresponds to one NAND string NS. The portions of the block insulating film 251, the charge storage film 252, and the tunnel insulating film 253 between a conductive layer 241 and an insulating layer 242 of the stacked body on one side and the semiconductor layer 254 on the other side form a memory layer.

The block insulating film 251, the tunnel insulating film 253, and the core insulating layer 255 are, for example, silicon oxide. The charge storage film 252 is, for example, silicon nitride. The semiconductor layer 254 and the cap layer 256 are, for example, polysilicon.

More specifically, the holes that penetrate the plurality of conductive layers 241 and correspond in position to the memory pillars are formed. The block insulating film 251, the charge storage film 252, and the tunnel insulating film 253 are sequentially stacked on the side surface of the hole. Also, the semiconductor layer 254 is formed so that its side surface is in contact with the tunnel insulating film 253.

The semiconductor layer 254 penetrates the stacked body of the conductive layers 241 and the insulating layers 242 in the Z-axis direction. The semiconductor layer 254 provides channel forming areas of the select transistor ST1, the select transistor ST2, and the memory transistors MT. Accordingly, the semiconductor layer 254 may also be considered to function as a signal line that connects current paths of the select transistor ST1, the select transistor ST2, and the memory transistors MT.

The core insulating layer 255 is provided inside the semiconductor layer 254. The core insulating layer 255 extends along the length of the semiconductor layer 254.

The cap layer 256 is provided on an upper end of the semiconductor layer 254 and the core insulating layer 255, and can also be in contact with the tunnel insulating film 253.

One of the conductive layers 231 is in contact with the cap layer 256 via a contact plug. This one of the conductive layers 231 functions as the bit line BL. The conductive layers 231 include a metal material.

The conductive layer 232 and the conductive layer 233 are connected to the conductive layer 231 via a contact plug.

Each of the conductive layers 241 that functions as a word line WL intersects with a portion of a memory pillar MP and a memory transistor MT is formed at the intersection. The conductive layer 241 that functions as a select gate line SGD forms a select transistor ST1 at the intersection with the memory pillar MP. The conductive layer 241 that functions as the select gate line SGS forms a select transistor ST2 at the intersection with the memory pillar MP.

Second Structural Example of Memory Chips 2a

Figure 8:
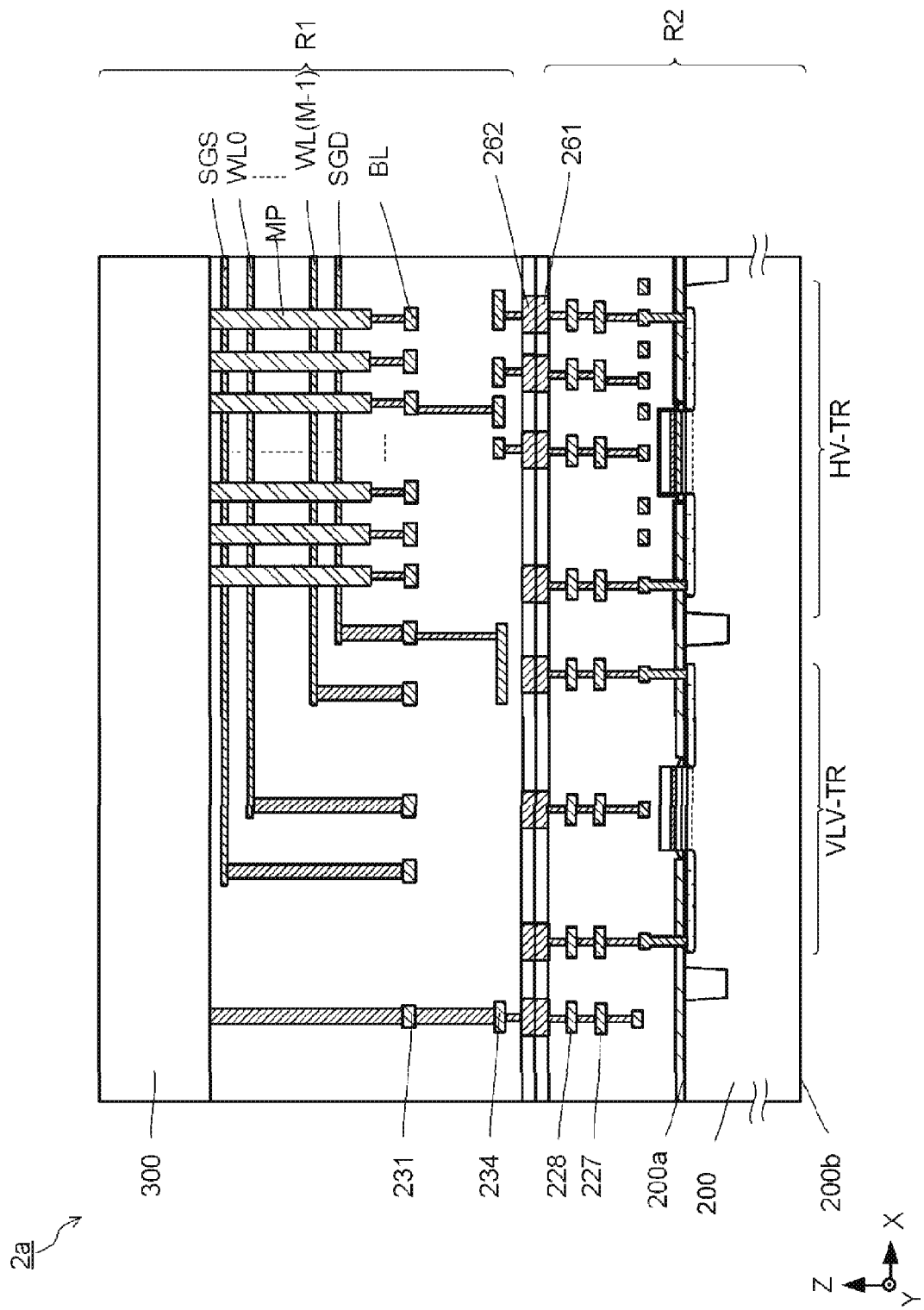
FIG. 8 is a cross-sectional view schematically illustrating a second structural example of a memory chip.

FIG. 8 is a cross-sectional view schematically illustrating a second structural example of the memory chip 2a. In addition, with respect to the same components as those already mentioned in description of the first structural example of the memory chip 2a, the description of the first structural example can be appropriately referred to.

The memory chip 2a illustrated in FIG. 8 includes the first area R1 that includes the memory cell array 20, and the second area R2 that is adjacent to the memory cell array 20 and includes peripheral circuits such as the command register 21, the address register 22, the sequencer 23, the driver 24, the row decoder 25, and the sense amplifier 26. In this example, the first area R1 and the second area R2 are formed on different substrates from one another and are then joined by bonding these substrates to each other.

FIG. 8 illustrates the high voltage drive transistor HV-TR and the ultra-low voltage drive transistor VLV-TR provided on the semiconductor substrate 200, a conductive layer 227, a conductive layer 228, the memory pillar MP provided on a substrate 300, the select gate line SGS, the word lines WL (the word line WL0 to the word line WL(M−1)), the select gate line SGD, the bit lines BL, the conductive layer 231, a conductive layer 234, a connection pad 261, and a connection pad 262.

The semiconductor substrate 200 has the same structure as illustrated in FIG. 4, and thus further description thereof is omitted here.

The structural examples of the high voltage drive transistor HV-TR and the ultra-low voltage drive transistor VLV-TR are the same as the structures illustrated in FIG. 5, and thus further description thereof is omitted here.

The memory pillar MP is connected to an electrode pad on the substrate 300. The memory pillar MP penetrates the stacked body including the select gate line SGS, the plurality of word lines WL, and the select gate line SGD, and is connected to the source line SL via the corresponding electrode pad. The other structural aspects of the memory pillar MP are the same as those illustrated in FIG. 7, and thus additional description thereof is omitted here.

One of the conductive layers 228 is connected to the conductor 221a, the conductor 221b, the conductor 222a, the conductor 222b, the conductor 223a, the conductor 223b, and the conductor 224 via a contact plug and the conductive layer 227. The conductor 221a, the conductor 221b, the conductor 222a, the conductor 222b, the conductor 223a, the conductor 223b, and the conductor 224 have the same structures as illustrated in FIG. 5, and thus the additional description thereof is omitted here.

One of the conductive layers 234 is connected to the electrode pad on the substrate 300 via a contact plug and conductive layer 231. Another one of the conductive layers 234 is connected to the bit line BL via a contact plug. Still another one of the conductive layers 234 is connected to the select gate line SGS, the plurality of word lines WL, or the select gate line SGD via a contact plug and conductive layer 231.

The connection pad 261 is on the semiconductor substrate 200 side. The connection pad 261 is connected to the conductive layer 228 via a contact plug. The connection pad 261 is, for example, a metal material such as copper or a copper alloy.

The connection pad 262 is on the substrate 300 side. The connection pad 262 is connected to the conductive layer 234 via a contact plug. The connection pad 262 is, for example, a metal material such as copper or a copper alloy.

The connection pad 261 and the connection pad 262 are directly joined (bonded) to each other by, for example, element diffusion between metals, van der Waals force, volume expansion, or recrystallization by melting. Further, the first area R1 and the second area R2 provided on the different substrates can be bonded to each other by the direct joining by element diffusion between insulators, van der Waals force, a chemical reaction such as dehydration condensation and polymerization, or the like.

The substrate 300 is not particularly limited, and for example, a wiring substrate may be used. The substrate 300 includes a plurality of electrode pads, for example, on a surface thereof. The plurality of electrode pads are connected to a memory pillar MP or a contact plug.

In the memory chip 2a as described in the first and second structural examples, the increase in the size of a chip may be prevented by locating wiring to which a low voltage as in the conductor 224 is applied on the same layer as the wiring for supplying a voltage to the gate electrode or the source-drain area of the high voltage drive transistor HV-TR according to the increase in the number of memory cells. However, in this case, the on-current of the high voltage drive transistor HV-TR may be reduced. The reduction of the on-current causes a malfunction of the operation of the semiconductor storage device.

Figure 9:
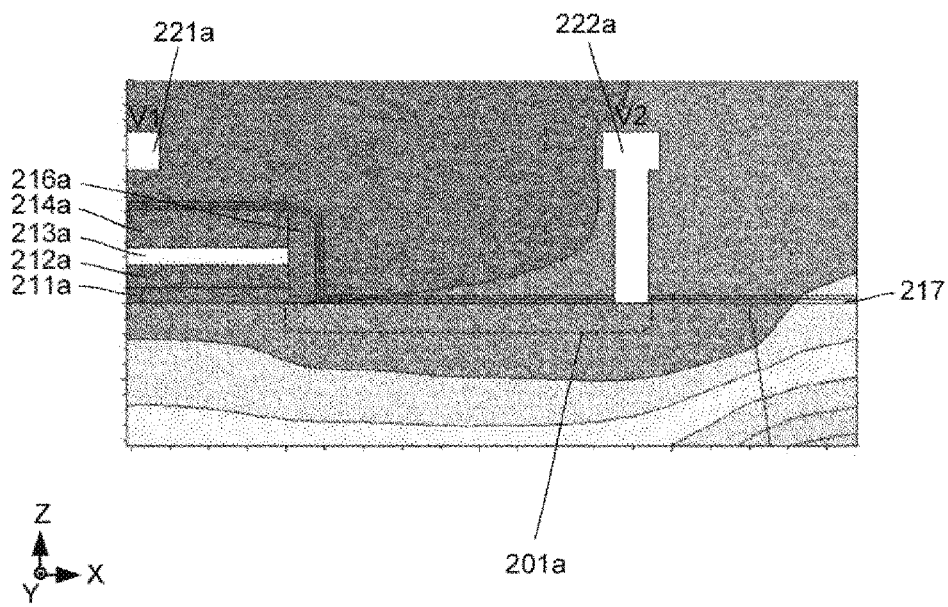
FIG. 9 is a schematic diagram illustrating an electric field distribution of a high voltage drive transistor.
Figure 10:
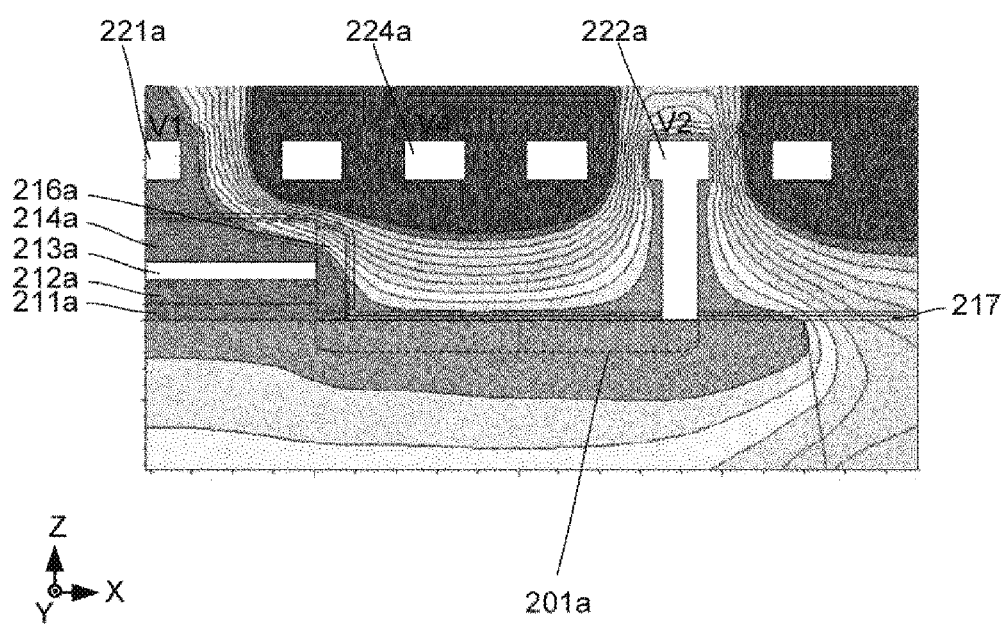
FIG. 10 is a schematic diagram illustrating an electric field distribution of a high voltage drive transistor.

FIGS. 9 and 10 are schematic diagrams illustrating electric field distributions of the high voltage drive transistor HV-TR. As illustrated in FIG. 9, when the conductor 224 is not provided, if the voltages V1 and V2 are applied to the conductor 221a and the conductor 222a, respectively, a sufficient electric field can be applied to the vicinity of the impurity area 201a. However, as illustrated in FIG. 10, when the conductor 224 is provided, if the voltages V1 and V2 are applied to the conductor 221a and the conductor 222a, respectively, it is difficult to apply a sufficient electric field to the vicinity of the impurity area 201a due to the influence of the electric field formed by the voltage V4 applied to the conductor 224.

Figure 11:
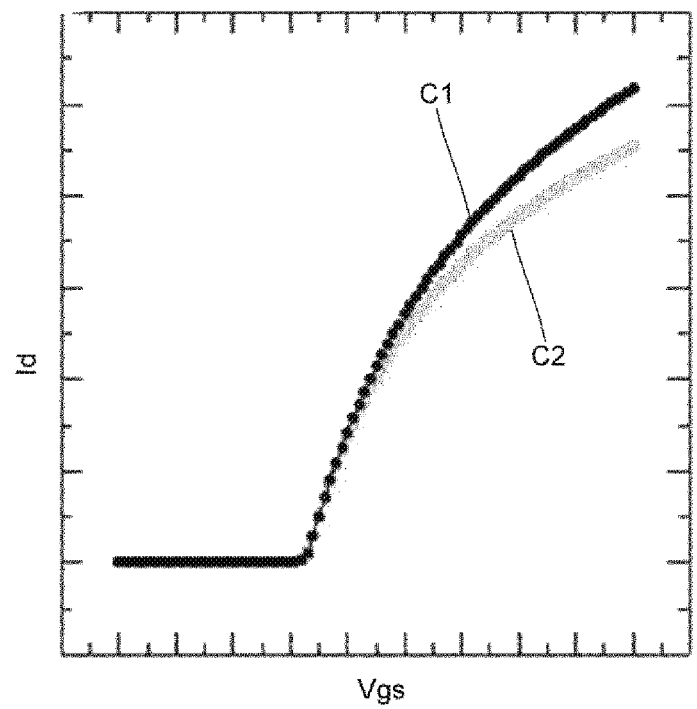
FIG. 11 is a diagram illustrating an example of a Vgs-Id curve of a high voltage drive transistor.

FIG. 11 is a diagram illustrating an example of a gate-source voltage (Vgs) vs. drain current (Id) curve (Vgs-Id curve) of the high voltage drive transistor HV-TR. A curve C1 is the Vgs-Id curve when the conductor 224 is not provided, and curve C2 is the Vgs-Id curve when the conductor 224 is provided. As illustrated in FIG. 11, if the conductor 224 is provided, the drain current decreases as compared with a case where the conductor 224 is not provided.

In the semiconductor device according to the present embodiment, the metal oxide film 219 is formed between the impurity area 201a and the conductor 224 in the Z-axis direction. Since the metal oxide film 219 has a high dielectric constant, a sufficient electric field can be applied to the vicinity of the impurity area 201a even when the conductor 224 is provided. Accordingly, a reduction of the on-current of the high voltage drive transistor HV-TR can be prevented.

Figure 12:
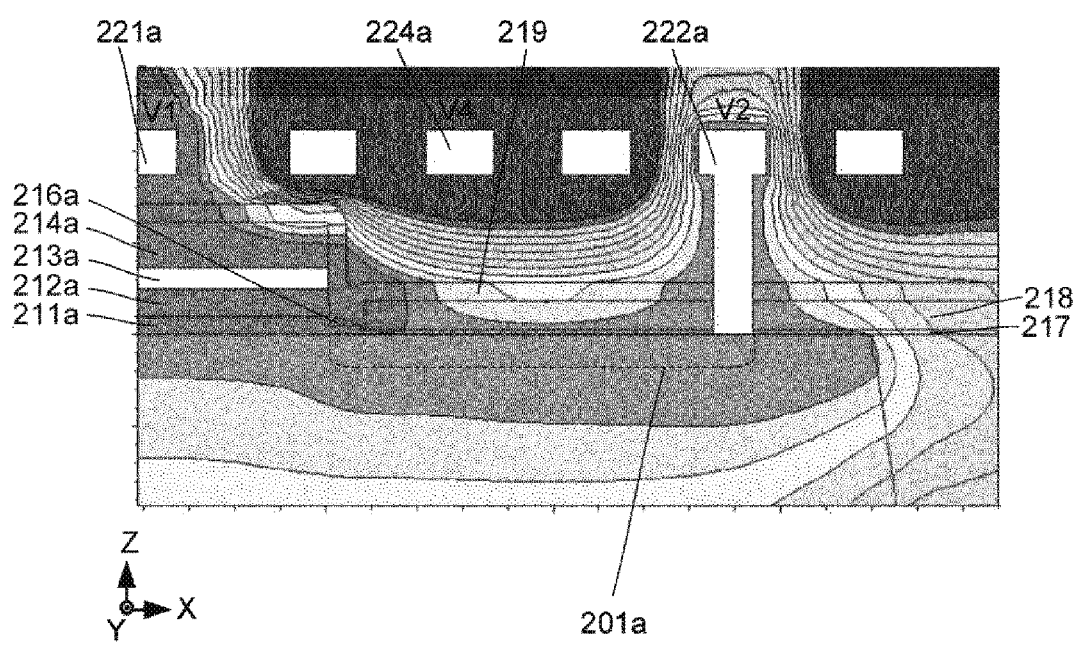
FIG. 12 is a schematic diagram illustrating an electric field distribution of a high voltage drive transistor.
Figure 13:
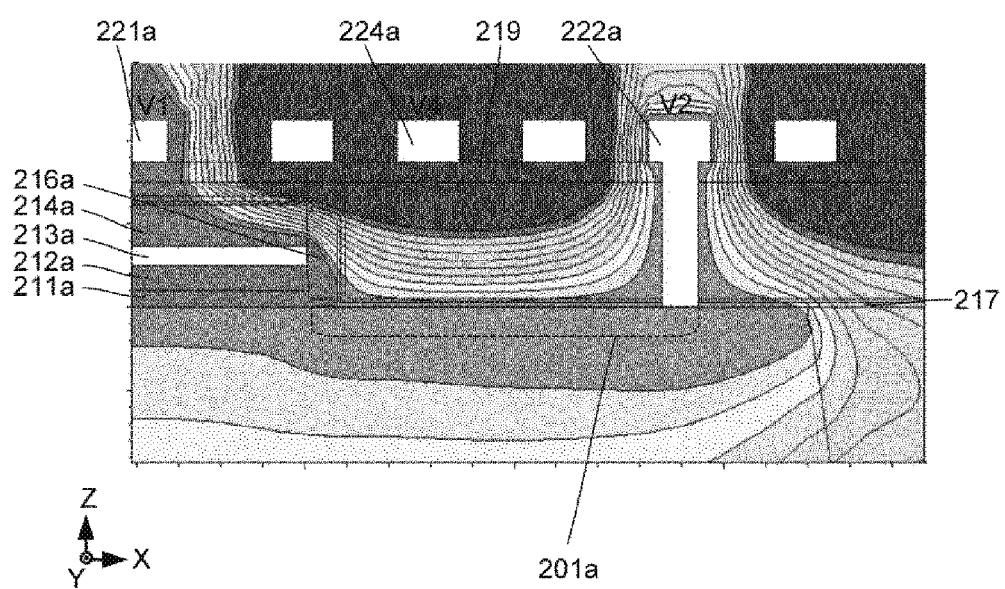
FIG. 13 is a schematic diagram illustrating the electric field distribution of a high voltage drive transistor.

FIGS. 12 and 13 are schematic diagrams illustrating the electric field distribution of the high voltage drive transistor HV-TR. As illustrated in FIG. 12, when a portion of the metal oxide film 219 is located at a position (device height) lower than the upper surface of the metal-containing layer 213a above the impurity area 201a and above the insulating layer 216a in the Z-axis direction, if voltages are applied to the conductor 221a and the conductor 222a, a sufficient electric field can be applied to the vicinity of the impurity area 201a. However, as illustrated in FIG. 13, if a portion of the metal oxide film 219 on the insulating layer 216a is located at a position (device height) higher than the upper surface of the metal-containing layer 213a, an electric field applied to the vicinity of the impurity area 201a becomes smaller. In this case, the reduction of the on-current of the high voltage drive transistor HV-TR may not be sufficiently prevented.

An example of a method of manufacturing a semiconductor device is described with reference to FIGS. 14 to 19. FIGS. 14 to 19 are cross-sectional views schematically illustrating aspects of the method of manufacturing a semiconductor device. Manufacturing steps from the formation of the high voltage drive transistor HV-TR and the ultra-low voltage drive transistor VLV-TR to the formation of the conductor 224 are described.

First, as illustrated in FIG. 14, the insulating layer 217 covers the high voltage drive transistor HV-TR and the ultra-low voltage drive transistor VLV-TR, and the insulating layer 218 covers the insulating layer 217. The insulating layer 217 and the insulating layer 218 can be formed, for example, by using a chemical vapor deposition (CVD).

Subsequently, as illustrated in FIG. 15, the insulating layer 217 and the insulating layer 218 are partially removed in the thickness direction by using chemical-mechanical polishing (CMP) to expose the upper surface of the insulating layer 214a and the upper surface of the insulating layer 214b.

Subsequently, as illustrated in FIG. 16, the insulating layer 218 is partially removed in the thickness direction so the upper surface of the insulating layer 218 becomes lower than the upper surface of the metal-containing layer 213a. The insulating layer 218 can be partially removed (thinned), for example, by reactive ion etching (RIE).

Subsequently, as illustrated in FIG. 17, a portion of the insulating layer 217 and at least a portion of the insulating layer 216a and the insulating layer 216b are removed so the upper surface of the insulating layer 216a and the upper surface of the insulating layer 216b becomes lower than the upper surface of the metal-containing layer 213a. A portion of the insulating layer 217 and at least a portion of the insulating layer 216a and the insulating layer 216b can be partially removed by reactive ion etching (RIE).

Subsequently, as illustrated in FIG. 18, the metal oxide film 219 is formed. The metal oxide film 219 can be formed, for example, by using sputtering or an atomic layer deposition (ALD). When the metal oxide film 219 covers the insulating layer 214a, the insulating layer 214b, the insulating layer 216a, the insulating layer 216b, and the insulating layer 218, unnecessary portions such those overlapping (when being viewed in the Z-axis direction) with the impurity area 201b, the impurity area 202b, and the channel forming area 203b in the metal oxide film 219 are removed so that the metal oxide film 219 can be formed above the high voltage drive transistor HV-TR without being formed above the ultra-low voltage drive transistor VLV-TR.

Thereafter, as illustrated in FIG. 19, the conductor 221a, the conductor 221b, the conductor 222a, the conductor 222b, the conductor 223a, the conductor 223b, and the conductor 224 are formed. These conductors can be formed by using sputtering or an atomic layer deposition (ALD).

In general, as a method of forming the other components, various known methods can be used. The above is the description of certain examples of a method of manufacturing a semiconductor device, and various modifications to and/or variations of the described example should be readily apparent to those of ordinary skill in the art.

While certain embodiments have been described, these embodiments have been presented by way of example only, and are not intended to limit the scope of the disclosure. Indeed, the novel embodiments described herein may be embodied in a variety of other forms; furthermore, various omissions, substitutions and changes in the form of the embodiments described herein may be made without departing from the spirit of the disclosure. The accompanying claims and their equivalents are intended to cover such forms or modifications as would fall within the scope and spirit of the disclosure.

What is claimed is:

1. A semiconductor device, comprising:
a semiconductor substrate with a first region of an n-type conductivity type, a second region of an n-type conductivity type spaced from the first region in a first direction along a surface of the substrate, and a third region between the first region and the second region in the first direction;
a gate insulating film above the third region in a second direction orthogonal to the surface;
a gate electrode above the gate insulating film in the second direction and including a metal-containing layer;
a first conductor above the gate electrode in the second direction and electrically connected to the gate electrode, the first conductor configured to be applied with a first voltage;
a second conductor above the first region in the second direction and electrically connected to the first region, the second conductor configured to be applied with a second voltage;
a third conductor above the first region in the second direction and configured to be applied with a third voltage that is lower than the first and second voltages; and
a metal oxide film between the first region and the third conductor in the second direction, wherein
an upper surface of the metal oxide film includes a first area having a height from the surface of the substrate in the second direction that is less than a height of an upper surface of the metal-containing layer from the surface of the substrate in the second direction.

2. The semiconductor device according to claim 1, wherein
a difference between the third voltage and the first voltage is 24.5 V or more, and
a difference between the third voltage and the second voltage is 24.5 V or more.

3. The semiconductor device according to claim 2, wherein the third conductor is between the first conductor and the second conductor in the first direction.

4. The semiconductor device according to claim 3, wherein
the gate electrode further includes a semiconductor layer of an n-type conductivity type between the gate insulating film and the metal-containing layer in the second direction, and
the metal oxide film is in contact with a side surface of the semiconductor layer.

5. The semiconductor device according to claim 1, wherein the third conductor is between the first conductor and the second conductor in the first direction.

6. The semiconductor device according to claim 5, wherein
the gate electrode further includes a semiconductor layer of an n-type conductivity type between the gate insulating film and the metal-containing layer in the second direction, and
the metal oxide film is in contact with a side surface of the semiconductor layer.

7. The semiconductor device according to claim 1, wherein
the gate electrode further includes a semiconductor layer of an n-type conductivity type between the gate insulating film and the metal-containing layer in the second direction, and
the metal oxide film is in contact with a side surface of the semiconductor layer.

8. The semiconductor device according to claim 1, further comprising:
a first insulating layer on the surface of the substrate in the first region, the first insulating layer being between the metal oxide film and the surface in the second direction.

9. The semiconductor device according to claim 8, further comprising:
a second insulating layer on the first insulating layer in the first region, the second insulating layer being between the third conductor and the first insulating layer in the second direction.

10. The semiconductor device according to claim 9, wherein the metal oxide film includes a portion adjacent to the second insulating layer in the first direction.

11. The semiconductor device according to claim 1, wherein the upper surface of the metal oxide film in a second area that is between the first area and the gate electrode has a height from the surface of the substrate that is lower than the height of the upper surface of the metal oxide film in the first area.

12. The semiconductor device according to claim 1, wherein a portion of the metal oxide film in the third region is above the gate electrode in the second direction.

13. A semiconductor device, comprising:
a semiconductor substrate with a first region of an n-type conductivity type, a second region of an n-type conductivity type spaced from the first region in a first direction along a surface of the substrate, a third region between the first region and the second region in the first direction, a fourth region of a first conductivity type outside the first, second, and third regions, a fifth region of the first conductivity type and spaced from the fourth region in a third direction along the surface of the substrate, and a sixth region between the fourth region and the fifth region in the third direction;
a first gate insulating film above the third region in a second direction orthogonal to the surface of the substrate;
a first gate electrode above the first gate insulating film in the second direction and including a metal-containing layer;
a second gate insulating film above the sixth region in the second direction;
a second gate electrode above the second gate insulating film in the second direction;
a first conductor above the first gate electrode in the second direction, the first conductor electrically connected to the first gate electrode and configured to be applied with a first voltage;
a second conductor above the first region in the second direction, the second conductor electrically connected to the first region and configured to be applied with a second voltage;
a third conductor above the first region in the second direction and configured to be applied with a third voltage that is lower than the first and second voltages; and
a metal oxide film between the first region and the third conductor in the second direction but not above the fourth, fifth, and sixth regions in the second direction, wherein
an upper surface of the metal oxide film includes a first area having a height from the surface of the substrate in the second direction that is less than a height of an upper surface of the metal-containing layer from the surface of the substrate in the second direction.

14. The semiconductor device according to claim 13, wherein the third conductor is between the first conductor and the second conductor in the first direction.

15. The semiconductor device according to claim 13, wherein
the first gate electrode further includes a semiconductor layer of an n-type conductivity type between the first gate insulating film and the metal-containing layer in the second direction, and
the metal oxide film is in contact with a side surface of the semiconductor layer.

16. The semiconductor device according to claim 13, further comprising:
a first insulating layer on the surface of the substrate in the first region, the first insulating layer being between the metal oxide film and the surface in the second direction.

17. The semiconductor device according to claim 16, further comprising:
a second insulating layer on the first insulating layer in the first region, the second insulating layer being between the third conductor and the first insulating layer in the second direction, wherein
the metal oxide film includes a portion adjacent to second insulating layer in the first direction.

18. The semiconductor device according to claim 13, wherein the upper surface of the metal oxide film in a second area that is between the first area and the gate electrode has a height from the surface of the substrate that is lower than the height of the upper surface of the metal oxide film in the first area.

19. The semiconductor device according to claim 13, wherein the first conductivity type is n-type.

20. A semiconductor storage device, comprising:
a memory cell;
a word line electrically connected to the memory cell;
a bit line electrically connected to the memory cell;
a semiconductor substrate with a first region of an n-type conductivity type, a second region of an n-type conductivity type spaced from the first region in a first direction along a surface of the substrate, and a third region between the first region and the second region in the first direction;
a gate insulating film above the third region in a second direction orthogonal to the surface;
a gate electrode above the gate insulating film in the second direction and including a metal-containing layer;
a first conductor above the gate electrode in the second direction and electrically connected to the gate electrode, the first conductor configured to be applied with a first voltage;
a second conductor above the first region in the second direction and electrically connected to the first region, the second conductor configured to be applied with a second voltage;
a third conductor above the first region in the second direction and configured to be applied with a third voltage that is lower than the first and second voltages; and
a metal oxide film between the first region and the third conductor in the second direction, wherein
the third conductor is electrically connected to the word line or the bit line, and
an upper surface of the metal oxide film includes a first area having a height from the surface of the substrate in the second direction that is less than a height of an upper surface of the metal-containing layer from the surface of the substrate in the second direction.

* * * * *